United States Patent
Anderson

[15] 3,693,054

[45] Sept. 19, 1972

[54] SEMICONDUCTOR HAVING A TRANSISTOR, A THYRISTOR AND A DIODE IN ONE BODY

[72] Inventor: Thomas A. Anderson, London, England

[73] Assignee: Westinghouse Brake and Signal Company Limited, London, England

[22] Filed: Sept. 15, 1971

[21] Appl. No.: 180,821

[30] Foreign Application Priority Data

Oct. 6, 1970 Great Britain..........47,430/70

[52] U.S. Cl...................................317/235, 317/235
[51] Int. Cl.................................................H01l 9/12
[58] Field of Search ................317/234, 235, 234 AB

[56] References Cited

UNITED STATES PATENTS

| | | | |
|---|---|---|---|
| 3,584,270 | 6/1971 | Philips | 317/235 |
| 3,590,339 | 6/1971 | Motto, Jr. et al. | 317/235 |
| 3,622,841 | 11/1971 | Zorogen | 317/235 |

*Primary Examiner*—James D. Kallam
*Attorney*—F. Shapoe et al.

[57] ABSTRACT

This disclosure is directed to a semiconductor device contained within an integral body of semiconductor material consisting of a first portion which constitutes effectively, a transistor, a second portion which constitutes effectively a thyristor and a third portion which constitutes effectively a diode. The thyristor portion of the device being disposed in the central portion of the body and the transistor and diode portions of the device being disposed in the peripheral portion of the body.

5 Claims, 2 Drawing Figures

SEMICONDUCTOR HAVING A TRANSISTOR, A THYRISTOR AND A DIODE IN ONE BODY

BACKGROUND OF THE INVENTION

1. Field of the Invention

This invention is in the field of semiconductor devices.

2. Prior Art

U.S. Pat. No. 3,584,270 teaches a semiconductor device in an integral body of semiconductor material consisting of a thyristor and a diode. The thyristor is disposed in the central portion of the body and the diode is disposed in the peripheral portion of the body.

SUMMARY OF THE INVENTION

The present invention provides a semiconductor device contained within an integral body of semiconductor material and consisting of a first portion which constitutes effectively a transistor, a second portion which constitutes effectively a thyristor and a third portion which constitutes effectively a P-N junction diode; one region of said diode having a first portion more heavily doped than a second portion; the collector region of the transistor being common with said second portion of said one region of the diode, said first portion of the region of the diode being immediately adjacent the P-N junction of the diode; the other region of the diode and the anode region of the thyristor being commonly connected to a first terminal of the device, the emitter region of the transistor being connected to a second terminal of the device, and a gate region of the thyristor portion being connected to a third terminal of the device.

The cathode region of the thyristor portion may be electrically connected to the base region of the transistor portion.

The device may be of concentric configuration with the thyristor portion being encircled by both the transistor portion and the diode portion.

DESCRIPTION OF THE DRAWINGS

For a better understanding of the nature of the present invention reference should be had to the following detailed description and drawings.

DESCRIPTION OF THE PREFERRED EMBODIMENTS

Figure 1:
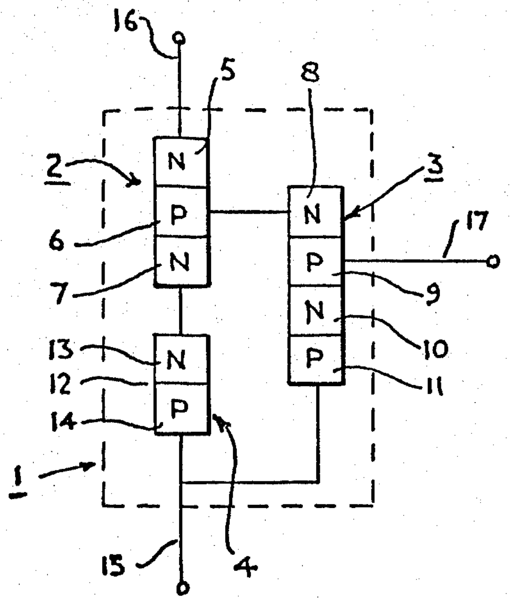
FIG. 1 of which is a schematic drawing of the device of this invention.

With reference to FIG. 1, the semiconductor device 1 of this invention consists of three portions shown schematically. The first of these portions is a transistor 2, the second of the portions is a thyristor 3, and the third of these portions is a diode 4.

The transistor 2 has an emitter region 5, a base region 6, and a collector region 7. The thyristor 3 has a cathode region 8, a gated base region 9, an ungated base region 10, and an anode region 11. The diode 4 has a P-N junction 12 on one side of which lies an N-type region 13 and on the other side of which lies a P-type region 14.

The N-type region 13 of the diode 4 is electrically connected to the collector region 7 of the transistor 2 and the cathode region 8 of the thyristor 3 is electrically connected to the base region 6 of the transistor 2.

The anode region 11 of the thyristor 3 is commonly connected with the P-type region 14 of the diode 4 by a common first terminal 15. The emitter region 5 of the transistor 2 is connected to a second terminal 16 of the device and the gated base region 9 of the thyristor 3 is connected to a third terminal 17 of the device.

Figure 2:
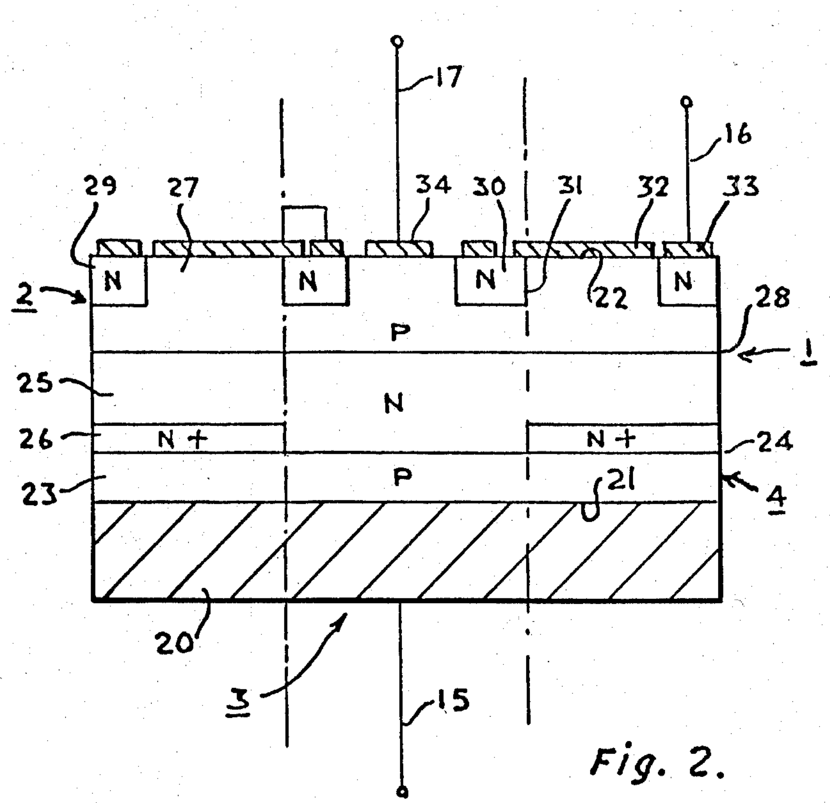
FIG. 2 is a side-view, partially in section of the semiconductor device of this invention.

The above is a description of the electrical configuration of the device which is shown in cross-sectional view in FIG. 2.

Referring to FIG. 2, the device 1 is mounted along major surface 21 on a base 30 comprised of electrically conductive material. The device 1 has a second major surface 22 which is substantially parallel to major surface 21.

Extending inwardly from the surface 21 is a first region 23 of P-type conductivity and interfacing therewith so as to form therebetween a P-N junction 24 is a second region 25 of N-type conductivity. The region 25 is divided into two portions; the first portion 26 being of N+-type conductivity and the second portion comprising the remainder of the region being of N-type conductivity.

It should be understood that regions denoted as N or P-type regions are doped to a concentration of from approximately $10^{14}$ to $10^{17}$ atoms of dopant per cubic centimeter of semiconductor material while regions denote as N+ or P+ -type regions are doped to a concentration of from approximately $10^{18}$ to $10^{21}$ atoms of dopant per cubic centimeter of semiconductor material.

Extending inwardly of the device 1 from the surface 22 is a third region 27 of P-type conductivity which forms a P-N junction 28 with the second region 25.

Lying within the P-type region 27 and extending inwardly of the device 1 from its surface 22 are two concentric N-type regions 29 and 30 respectively.

Bridging the P-N junction 31 formed between the N-type region 30 and the P-type region 27 is contact of electrically-conductive material 32 which bridges the P-N junction 31.

Contacting the N-type region 29 is a metal electrode 33 and contacting that portion of the P-type region 27 which extends to the surface 22 of the device 1 within the N-type region 30 is another metal electrode or contact 34.

The base 20 is connected to the terminal 15 of the device, the electrode or contact 33 is connected to the terminal 16 of the device and the electrode 34 is connected to the terminal 17 of the device.

The construction of FIG. 2 provides the transistor 2, the thyristor 3 and the diode 4 of FIG. 1.

The construction shown in FIG. 2 is a concentric construction with the thyristor 3 being in the center of the body of semiconductor material and constituted by the N-type region 30 (the cathode region 8 of FIG. 1), the central portion of the P-type region 27 (the gated base region 9 of FIG. 1), the central portion of the N-type region 25 (the ungated base region 10 of FIG. 1), and the central portion of the P-type region 23 (the anode region 11 of FIG. 1). Encircling the thyristor 3 are both the transistor 2 and the diode 4. The transistor 2 is constituted by the N-type region 29 (the emitter region 5 of FIG. 1), the peripheral portion of the P-type region 27 (the base region 6 of FIG. 1), and the peripheral portion of the N-type region 25 (the collector region 7 of FIG. 1). The diode 4 is constituted by the peripheral portion of the N-type region 25 (the N-type region 13 of FIG. 1) and the peripheral portion of the P-type region 23 (the P-type region 14 of FIG. 1). The connection in FIG. 1 of the cathode region 8 of the thyristor 3 with the base region 6 of the transistor 2 is provided by the contact 32 of FIG. 2.

The connection of the anode region 11 of the thyristor 3 with the P-type region 14 of the diode 4 is provided by the base 20 of FIG. 2.

The peripheral portion of the N-type region 25 is common to both the collector region 7 of the transistor 2 and the N-type region 13 of the diode 4 (see FIG. 1).

The combined transistor and diode portions encircling the transistor portion 3 are prevented from switching as a thyristor by the presence of the highly doped portion 26 of region 25 which greatly reduces the injection from the P-type region 23 into the peripheral portion of the N-type region 25.

In the above-described device, the highly doped portion 26 of region 25 (which needs to be only relatively thin) may either be formed by diffusion or by epitaxial deposition into a slice of semiconductor material extending downwardly (as seen in FIG. 2) from face 22 to the P-N junction 24.

The P-type region 23 may also be formed by epitaxial deposition.

I claim as my invention:

1. A semiconductor contained within an integral body of semiconductor material and comprised of; a first portion which constitutes a transistor, a second portion which constitutes a thyristor and a third portion which constitutes a diode; one region of said diode having a first portion more heavily doped than a second portion; the collector region of the transistor being common with said second portion of said one region of the diode, said first portion of the one region of the diode being immediately adjacent the P-N junction of the diode; the other region of the diode and the anode region of the thyristor being commonly connected to a first terminal of the device, the emitter region of the transistor being connected to a second terminal of the device, and a gate region of the thyristor portion being connected to a third terminal of the device.

2. The device of claim 1 in which the cathode region of the thyristor is electrically connected to the base region of the transistor.

3. The device of claim 1 in which the thyristor is disposed centrally within the body of semiconductor material and is completely surrounded by the transistor and diode.

4. A semiconductor device comprising a body of semiconductor material, said body having opposed, substantially parallel, major top and bottom surfaces, a first region having a first-type of semiconductivity, said first region having top and bottom surfaces which are essentially parallel, the bottom surface of said first region comprising the bottom surface of the body of semiconductor material, a second region having a second-type of semiconductivity disposed on the top surface of said first region, a P-N junction between said first and said second regions, said second region having a first portion formed in its periphery and in contact with said first region along the P-N junction therebetween, said first portion being of said second-type of semiconductivity and doped to a higher concentration than the remaining portion of said second region, said first portion having a thickness less than the thickness of said second region, a third region having said first-type of semiconductivity disposed on the top surface of said second region, a P-N junction between said second and third regions, said third region extending from the P-N junction to the top surface of the body, a fourth region having said second-type of semiconductivity, said fourth region being disposed about the periphery of the body, extending into said third region from the top surface of the body and forming a P-N junction with said third region, a fifth region having said second-type of semiconductivity, said fifth region extending into said third region from the top surface of the body and forming a P-N junction with said third region, said fifth region being spaced apart from said fourth region, a first electrical contact affixed to the bottom surface of said body of semiconductivity material for making electrical contact with said first region, a second electrical contact disposed on the top surface of the body of semiconductor material for making electrical contact with said third region, a third electrical contact affixed to said fourth region, a fourth electrical contact affixed to said third and said fifth regions, and a fifth electrical contact affixed to said fifth region.

5. The semiconductor device of claim 4 in which said fifth region, and the central portions of; said third region, said second region and said first regions form a thyristor; said fourth region and peripheral portions of said third and second regions for a transistor; and peripheral portions of said first and second regions form a diode.

* * * * *